US011726117B2

(12) United States Patent
Meranda et al.

(10) Patent No.: US 11,726,117 B2
(45) Date of Patent: Aug. 15, 2023

(54) HIGH FREQUENCY DATA TRANSCEIVER AND SURGE PROTECTION RETROFIT FOR A SMART METER (71) Applicant: Florida Power & Light Company, Juno Beach, FL (US)

(72) Inventors: Adam D. Meranda, Jupiter, FL (US); Bryan Kitchener, Boynton Beach, FL (US); Christopher Collins, North Palm Beach, FL (US)

(73) Assignee: FLORIDA POWER & LIGHT COMPANY, Juno Beach, FL (US)

( * ) Notice: Subject to any disclaimer, the term of this patent is extended or adjusted under 35 U.S.C. 154(b) by 564 days.

(21) Appl. No.: 16/863,363

(22) Filed: Apr. 30, 2020

(65) Prior Publication Data
US 2021/0341519 A1    Nov. 4, 2021

(51) Int. Cl.
*G01R 22/06* (2006.01)
*H02H 9/00* (2006.01)
(Continued)

(52) U.S. Cl.
CPC ......... *G01R 22/063* (2013.01); *G01D 4/008* (2013.01); *H02H 9/005* (2013.01); *H04B 1/38* (2013.01); *H04W 84/042* (2013.01)

(58) Field of Classification Search
CPC ...... G01R 22/063; G01D 4/008; G01D 9/005; H02H 9/005; H04B 1/38; H04W 84/042; Y02B 90/20; Y04S 20/30
See application file for complete search history.

(56) References Cited

U.S. PATENT DOCUMENTS 4,872,847 A * 10/1989 Fennell .................. G01R 11/04
                                                                    439/133
5,717,325 A    2/1998 Leeb et al.
(Continued)

FOREIGN PATENT DOCUMENTS

CN        102445595 A    5/2012
CN        102735955 A    10/2012
(Continued)

OTHER PUBLICATIONS

Jim Hanson "Meter Collars for Distributed Generation" Business & Technology Strategies, Jan. 2016.
(Continued)

*Primary Examiner* — Amine Benlagsir
(74) *Attorney, Agent, or Firm* — Tarolli, Sundheim, Covell & Tummino, LLP (57) ABSTRACT A high frequency data recorder ("HFDR") can include a first set of contacts, on a first side of the HFDR, that are pluggable into a first meter receptacle of a meter box, wherein the first meter receptacle provides a connection to a power supply and a connection to a load. The HFDR also includes a second set of contacts, on a second side of the HFDR, that form a second meter receptacle. The second meter receptacle provides another connection to the power supply and another connection to the load. The HFDR can further include a processor that accesses a non-transitory machine readable memory that stores instruction that when executed cause the processor to passively measures current downstream from the meter box. The HFDR still further includes a wireless transceiver that wirelessly transmits data characterizing the measured current.

18 Claims, 8 Drawing Sheets (51) Int. Cl.
*G01D 4/00* (2006.01)
*H04B 1/38* (2015.01)
*H04W 84/04* (2009.01)

(56) References Cited

U.S. PATENT DOCUMENTS

| | | | |
|---|---|---|---|
| 7,248,179 B2 | 7/2007 | Smit | |
| 8,476,895 B2* | 7/2013 | Higuma | G01R 21/06 |
| | | | 324/142 |
| 9,467,754 B1* | 10/2016 | Sparks | H04W 4/12 |
| 9,689,901 B2 | 6/2017 | Shamir et al. | |
| 10,184,963 B2 | 1/2019 | Dawley et al. | |
| 10,426,068 B1* | 9/2019 | Danielson | H05K 9/0043 |
| 2002/0084914 A1* | 7/2002 | Jackson | G01R 22/065 |
| | | | 340/870.02 |
| 2008/0106434 A1* | 5/2008 | Winter | G01D 4/006 |
| | | | 340/870.2 |
| 2010/0323555 A1 | 12/2010 | Geiger et al. | |
| 2011/0254697 A1* | 10/2011 | Casey | G01D 4/002 |
| | | | 340/870.02 |
| 2014/0028323 A1* | 1/2014 | McGuire | G01R 31/66 |
| | | | 324/508 |
| 2015/0316594 A1 | 11/2015 | Kania et al. | |
| 2017/0093160 A1* | 3/2017 | Bell | G05F 1/66 |
| 2018/0074123 A1* | 3/2018 | Pambucol | G01R 31/31701 |
| 2018/0188072 A1* | 7/2018 | Barnett, Jr. | G06Q 50/06 |
| 2019/0004098 A1* | 1/2019 | Wong | G05B 23/0205 |

FOREIGN PATENT DOCUMENTS

| | | |
|---|---|---|
| CN | 103105556 A | 5/2013 |
| GB | 2474037 A | 4/2011 |
| KR | 960030288 A | 8/1996 |
| WO | 2012160062 A1 | 11/2012 |
| WO | 2013081719 A2 | 6/2013 |
| WO | 2015059272 A1 | 4/2015 |

OTHER PUBLICATIONS

Generlink Fact Sheet "A new meter collar device that makes connecting a portable generator safe and easy".

* cited by examiner

HIGH FREQUENCY DATA TRANSCEIVER AND SURGE PROTECTION RETROFIT FOR A SMART METER

TECHNICAL FIELD

The present disclosure relates to power metering and more particularly to systems and methods for implementing a high frequency data recorder that is positioned between a meter and a meter box.

BACKGROUND

An electricity meter, electric meter, electrical meter, or energy meter is a device that measures the amount of electric energy consumed by a residence, a business, or an electrically powered device. Electric utilities use electric meters installed at customers' premises for billing purposes. Electricity meters are typically calibrated in billing units, the most common one being the kilowatt hour (kWh). Electricity meters are usually read once each billing period. Some meters may measure use of power over a period of time. "Time of day" metering allows electric rates to be changed during a day, to record usage during peak high-cost periods and off-peak, lower-cost, periods. Also, in some areas meters have relays for demand response load shedding during peak load periods.

A power meter operates by continuously measuring the instantaneous voltage (volts) and current (amperes) to give energy used (in joules, kwH etc.). Meters for smaller services (such as small residential customers) can be connected directly in-line between source and customer.

SUMMARY

One example relates to a high frequency data recorder ("HFDR") that can include a first set of contacts, on a first side of the HFDR, that are pluggable into a first meter receptacle of a meter box, wherein the first meter receptacle provides a connection to a power supply and a connection to a load. The HFDR can also include a second set of contacts, on a second side of the HFDR, that form a second meter receptacle, wherein the second meter receptacle provides another connection to the power supply and another connection to the load. The HFDR can further include a processor that accesses a non-transitory machine readable memory that stores instruction that when executed cause the processor to passively measure current downstream from the meter box. The HFDR can still further include a wireless transceiver that wirelessly transmits data characterizing the measured current.

Another example relates to a system for measuring and transmitting power measurements. The system can include a power collar that can have a first side with connectors pluggable into a meter receptacle of a meter box, wherein the meter receptacle provides a connection to a power supply and a load representing electrical equipment. The power collar can also include a second side, opposite the first side, the second side comprising second meter receptacle for a meter and an HFDR that can include processor that accesses a non-transitory machine readable memory that stores instruction that when executed cause the processor to passively measures power supplied to the load at least 100 samples per second. The HFDR can also include a transceiver that wirelessly transmits data characterizing measured power. The system can still further include a meter pluggable into the second meter receptacle of the power collar. The system can also include a remote server that receives the data characterizing measure power from the HFDR, wherein the remote server employs a power pattern detection module to analyze the data.

Still another example relates to a method for measuring and transmitting power measurements. The method can include measuring power consumed by a plurality of loads at a corresponding plurality of meter boxes by a corresponding plurality of HFDRs. Each load of the plurality of loads represents electrical equipment at a respective customer premises, and a given HFDR of the plurality of HFDRs is installed between a previously operational meter and a previously operational meter box. The method can also include transmitting, by a first HFDR of the plurality of HFDRs, a first stream of data characterizing power consumed at a first load of the plurality of loads, wherein the first HFDR wirelessly transmits the first stream of data to a server via a first protocol. The method can further include transmitting, by a second HFDR of the plurality of HFDRs, a second stream of data characterizing power consumed at a second load of the plurality of loads by a corresponding second HFDR, wherein the second HFDR transmits the second stream of data to the server via a second protocol. The method can still further include generating, by a power pattern detection module hosted by the server, an expected power pattern for the first and second streams of data via.

DETAILED DESCRIPTION

The present disclosure relates to systems and methods for collecting and transmitting data characterizing power consumed by a load via a high frequency data recorder (HFDR). More particularly, the HFDR can include a first set of contacts that are pluggable into a meter receptacle situated in a meter box and second set of contacts that form a meter receptacle for a power meter to plug into. The meter box can be implemented as an electrical meter box installed by a utility provider to house a meter that measures power consumed by a customer premises (e.g., a domicile or an industrial building). The HFDR can be configured/programmed to sample power delivered to a load (e.g., electrical equipment within the customer premises) at a high frequency (e.g., 100 times a second or more) and transmit sampled power data to a remote server via a cellular network. Accordingly, the HFDR can extend the functionality of a meter box containing the meter receptacle that the first set of contacts of the HFDR can be plugged into without obstructing the functionality of the power meter plugged into the second set of contracts of the HFDR. Thus, the HFDR can be retrofitted into the meter box without requiring reconfiguration of the meter box and/or the meter. Additionally, because the HFDR can be installed in the meter box, in situations where the meter box is positioned on an outside of the customer premises, the HFDR can be installed without entry into the customer premises.

Figure 1:
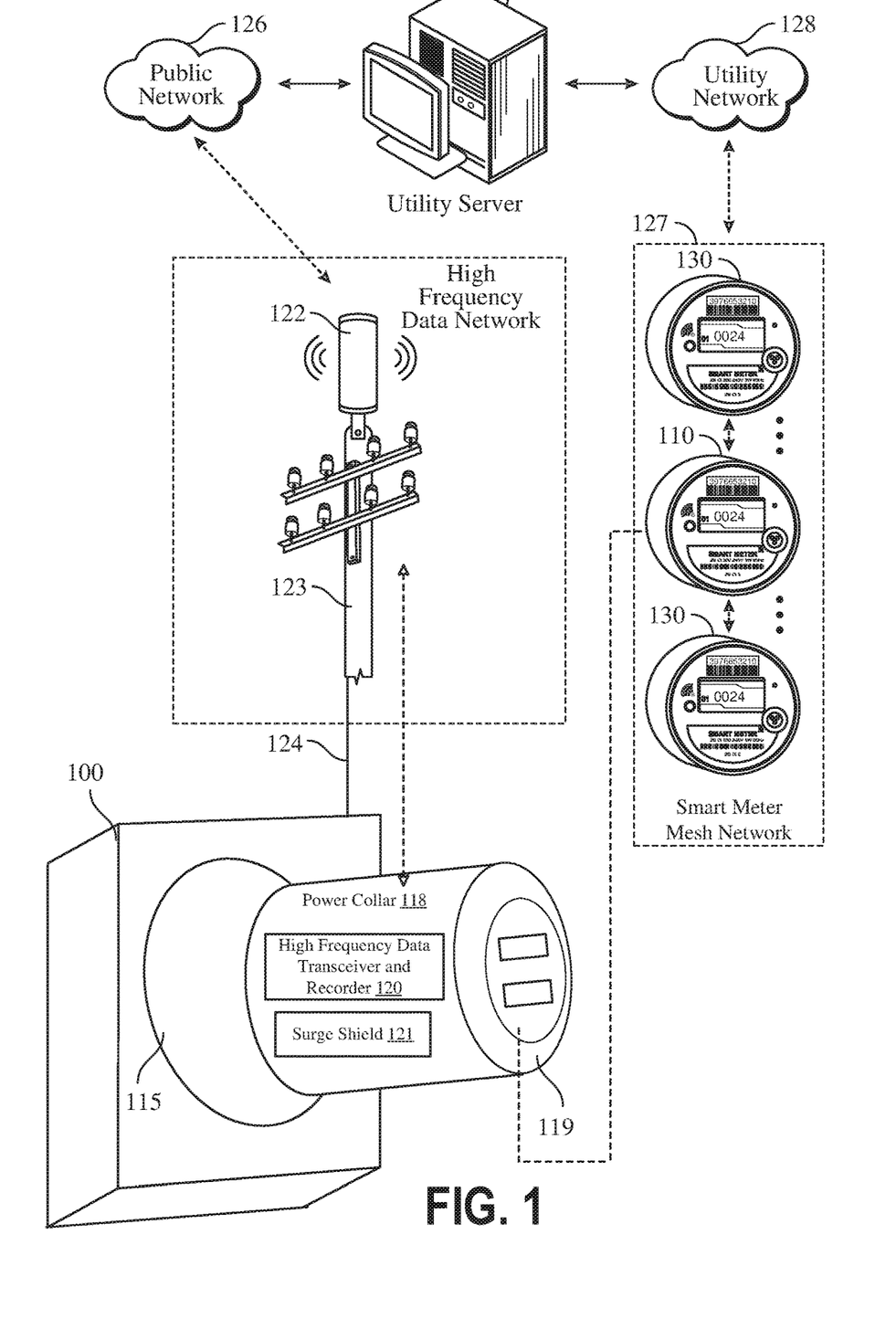
FIG. 1 illustrates an example of a high frequency data recorder ("HFDR").

FIG. 1 illustrates a meter box 100 configured to house a meter 110. The meter box 100 can be implemented as an electrical meter box installed by a utility provider to house the meter 110 that measures power consumed by a customer premises (e.g., a domicile or an industrial building). Electrical equipment within the customers premises can be referred to as a load. The meter box 100 includes a meter socket 115 that configured to receive contacts of the meter 110. More particularly, the meter socket 115 is configured to receive the meter 110 that can connect the power supply and the load. Thus, the meter box 100 is employable as a junction that provides a connection between power, the load of the customer premises and a meter 110. The meter socket 115 further includes contacts that provide connections to the power supply and the load. In some examples, the meter 110 may be implemented as power meter that measures power consumed by the load. In some examples, the meter 110 can be implemented as an analog meter. In other examples, the meter 110 can be implemented as a smart meter. A smart meter can sample power consumption at the load at 15 times per second.

A power collar 118 can be pluggable into the meter socket 115 of the meter box 100 and configured to receive a meter by forming a meter receptacle 119. The power collar 118 can further house a high frequency data transceiver and recorder, which can alternatively be referred to as a high frequency data recorder (HFDR) 120 that can be situated between the meter box 100 and the meter 110. The power collar 118 can further include a surge protector 121 such as a SURGESHIELD® to provide surge protection to the meter 110 and to the load. The HFDR 120 includes a first set of contacts, on a first side of the HFDR 120, that are configured to plug into the meter socket 115 of the meter box 100. The HFDR 120 is configured to have a second set of contacts, on a second side opposite the first side, that form a meter receptacle 119. The meter receptacle 119 can have the same shape as the meter socket 115 of the meter box 100. Accordingly, the meter 110 is pluggable into the HFDR 120 on the second side of the HFDR 120 and the meter socket 115 receives the first side of the HFDR 120. In this manner, the HFDR 120 passively measures (e.g., samples) power delivered to the load, such that the HFDR 120 measures power without disturbing the power delivered to the load or the meter 110 measurement of the power consumed by the load. Stated differently, the HFDR can sample the power consumed by load without requiring modification to the meter box 100 or the meter 110.

The HFDR 120 includes circuitry that is capable of sampling the power delivered to the load. In some examples, the HFDR 120 samples the power delivered to the load at least 2000 times per second (e.g., millions of samples per second). Accordingly, the HFDR 120 can sample power at a much higher rate than the 15 times per second sampling rate of a smart meter. As one example, the HFDR 120 can include a digital signal processor (DSP) or a controller to sample the power delivered to the load. The circuitry of the HFDR (including the DSP or controller) can be implemented with a general purpose processor with one or more cores. Additionally, the HFDR 120 includes a transceiver modem that enables wireless communications with a node 122. The node 122 can be a component of a High Frequency Data Network, as labeled in FIG. 1. As one example, the node 122 can be a 5G node 122 mounted on a power pole 123, which provides power to the meter box 100 through a power line 124. The 5G node 122 and power pole 123 can be implemented with a pole top antenna system, such as but not limited to the AT&T® 5G pole top system. Accordingly, the 5G node 122 enables the HFDR 120 to communicate with a utility server 125 via a public network 126. The HFDR 120 may communicate other nodes of a point-to-point network, such as a cellular network or a WiFi network. In examples where the HFDR 120 communicates with a cellular network, the cellular network can be implemented with a 3G network, a 4G Long-Term Evolution (LTE) network, a 5G network, etc. In some examples, the HFDR 120 can send data characterizing the sampled power signal to the network.

In the examples illustrated, the meter socket 115 of the meter box 100 has two sets of contacts. A first set of contacts includes a first contact for connecting to a "hot wire" and a second contact for connecting to a "neutral wire." The first set of contacts is used to connect to a power source. The second set of contacts also includes a first contact for connecting to a "hot wire" and a second contact for connecting to a "neutral wire." The second set of contacts is used to connect to a load. Additionally, both the first set of contacts and the second set of contacts may include a "ground wire" for safely connecting to a protective earth conductor. The first set and second set of contacts of the meter socket are not connected, such that the first set and the second set of contacts of the meter socket 115 form an open circuit. When a meter is plugged into the meter receptacle 119, the meter closes the circuit by connecting to the first set of contacts and the second set of contacts.

Accordingly, the first side of the HFDR 120 comprises a first set of contacts that are configured to plug into the meter socket 115, in a manner similar that of the meter 110. However, the HFDR 120 does not close the circuit the is formed by the first and second subset of contacts, but forms a "passive layer" that enables power to flow through the HFDR 120. Accordingly, the HFDR 120 forms another meter receptacle 119 on a second side of the HFDR 120 for the meter 110 to plug into. When a meter is plugged into the second side of the HFDR 120 opposite the first side, the meter 110 completes the circuit by connecting to the first subset of contacts and the second subset of contacts, as with the meter socket 115. The HFDR 120 passively measures (through sampling) the power that flows through the HFDR 120 and that is delivered to the load, but does not substantially impact the power flowing therethrough. Moreover, the HFDR 120 operates without requiring data communication to the meter 110 or an electrical device that is downstream from the HFDR 120, such as the meter socket 115 or the load.

As noted, the meter 110 can be implemented with a smart meter. In such a situation, the meter 110 can communicate on a mesh network 127 that provides a utility network 128 with meter data. In a mesh network 127, data communicated through the mesh network 127 flows to pass through a plurality of other meters 130. The other meters 130 in the mesh network 127 can be implemented as smart meters with the same or similar features as the meter 110 coupled to the meter receptacle 119. Each pass through a meter 130 is referred to as a "hop," such that a plurality of hops strung together form a stream of data. A stream of data is to be delivered to a utility provider at the end of the string of hops. Accordingly, data accumulates at each hop, which severely limits available bandwidth on the mesh network 127. More particularly, the data accumulating at each hop limits the amount of data that can be collected at each meter 130 and/or the number of hops that can be strung together. The HFDR 120 communicates on a high bandwidth point-to-point network, such as a cellular network or a WiFi network. For example, in some instances, the HFDR 120 communicates with a cell tower on a cellular network, thereby communicating with a public network through a gateway. In other examples, the HFDR 120 is configured to communicate with the public network through a local area network (LAN) such as through a WiFi gateway. Because the HFDR 120 can communicate with a high bandwidth point-to-point network rather than a mesh network 127, the HFDR 120 removes the need to limit the amount of data that is collected. Additionally, the HFDR 120 can implement a sampling rate a higher frequency on a cellular network than by communicating with an LAN. For example, the HFDR 120 may be configured to communicate on a cellular network such 5G, 4G LTE or 3G.

The HFDR 120 can be retrofitted on to the meter box 100. Retrofitting refers to the addition of new technology or features to older systems, such as the measures taken to allow new or updated parts to be fitted to old or outdated assemblies. Retrofitting can improve a system's overall functionality by using advanced and updated equipment and technology. The HFDR 120 provides updated equipment to the meter box 100, by measuring power at a high frequency and transmitting data via a cellular network. That is, the HFDR 120 adds circuitry that enables the power collar 118 to passively measure power and communicate power measurements via cellular network. Additionally, installation of the HFDR 120 involves plugging the first side of the HFDR into a meter socket 115 of the meter box 100 and plugging the meter 110 into the second side of the HFDR 120. Installing the HFDR 120 does not require modification of the meter 110 or the meter box 100. Additionally or alternatively, in some examples, the HFDR 120 is integrated with a power collar. In such a situation, the power collar may be implemented as a surge shield.

In some examples, a data recorder is to be installed inside the customer premises to measure power consumed by the customer premises. Furthermore, the data recorder communicates with a local network associated with the customer premises. In such a situation, the meter box 100 is attached to a customer premises, such that the meter box 100 is accessible outside of the customer premises. Because the HFDR 120 is plugged into the meter box 100, the HFDR 120 avoids the need to install a data recorder inside the customer premises. Additionally, in some examples, the HFDR 120 can communicate on a cellular network, such that the HFDR 120 does not need to communicate with a local network associated with the customer premises (e.g., a local WiFi network). Accordingly, the HFDR 120 avoids the need to enter a customer premises to install a data recorder, or use a network associated with a customer premises to transmit data.

Figure 2:
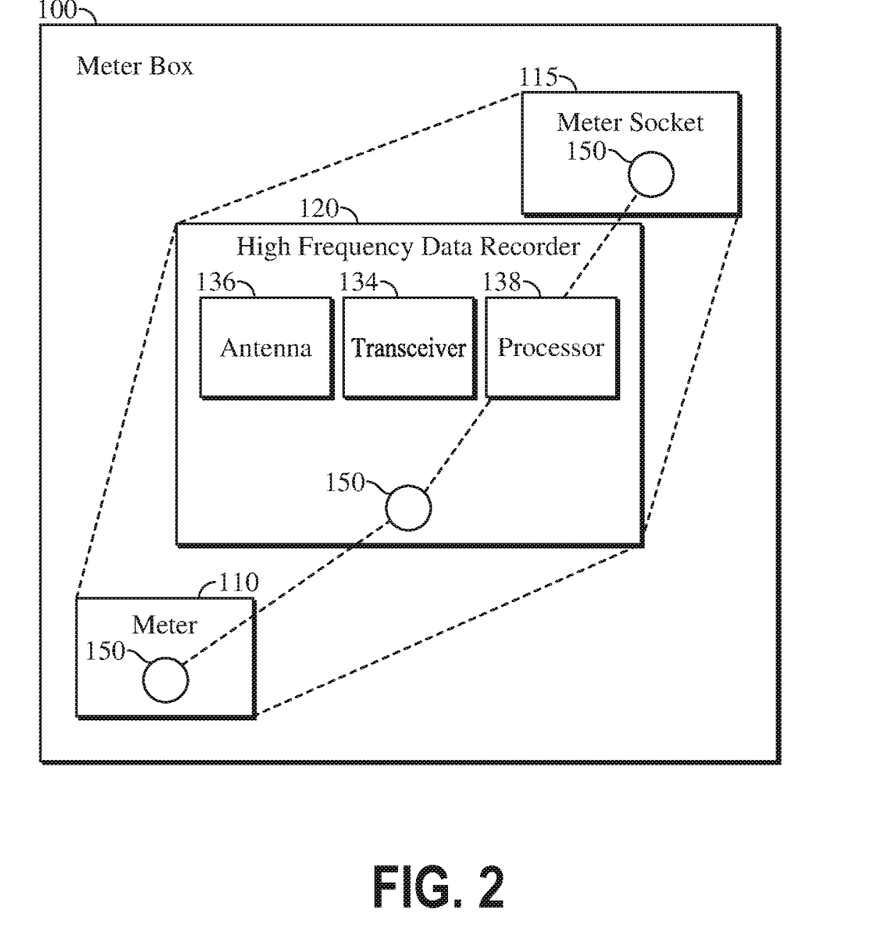
FIG. 2 illustrates a block diagram of a HFDR situated between a meter receptacle and a meter.

FIG. 2 illustrates an exploded block diagram of the meter box 100 of FIG. 1, wherein the meter box 100 houses the HFDR 120 that is installed between the meter 110 and the meter socket 115 of the meter box 100. For purposes of simplification of explanation, the same reference numbers are employed in FIGS. 1 and 2 to denote the same structure. Moreover, reference numbers are not reintroduced. As previously described, the first side of the HFDR 120 includes a first set of contacts pluggable into the meter socket 115 and the second side of the HFDR 120 includes a second set of contacts the form a meter receptacle 119 for a meter 110 to plug into. Furthermore, the HFDR 120 includes the data transceiver 134 that communicates with an antenna 136 of the HFDR 120 to enable the HFDR 120 to communicate on a point-to-point wireless network. Further still, the HFDR 120 can include a processor 138. In some examples, the processor 138 can be a general-purpose processor with one or more cores. In other examples, the processor 138 can be a low power processor. The processor can access a non-transitory machine readable memory (e.g., random access memory or flash memory) that when executed cause the processor to perform particular operations. In other examples, the processor can be implemented as an embedded controller with embedded machine readable instructions. As demonstrated in FIG. 2, the HFDR 120 is physically, electrically and logically situated between the meter 110 and the meter socket 115 of the meter box 100. The HFDR 120, meter 110 and meter socket 115 are each connected at a common connection point 150. Accordingly, the processor 138 (or controller) can be programmed to sample current downstream from the meter socket 115 at the common connection point 150.

Figure 3A:
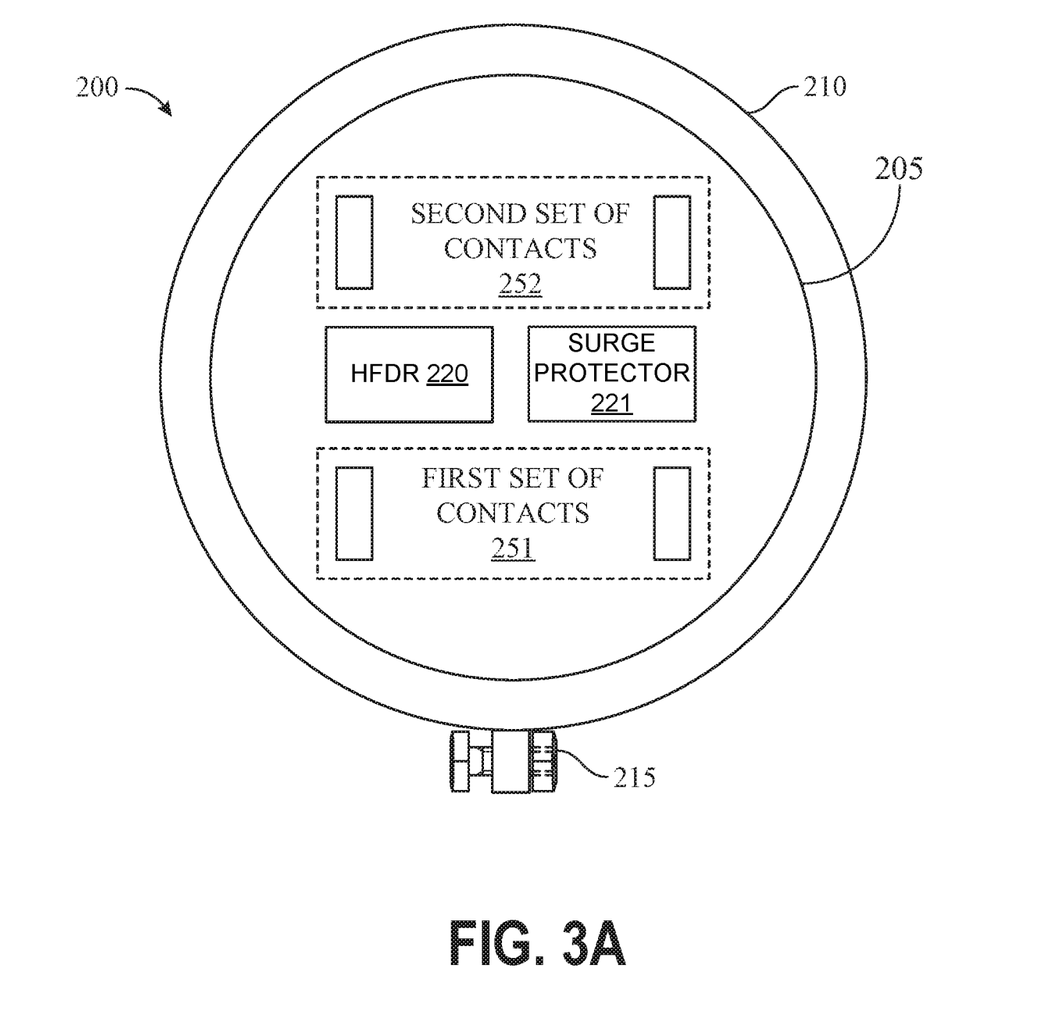
FIG. 3A illustrates a first side view of a power collar.
Figure 3B:
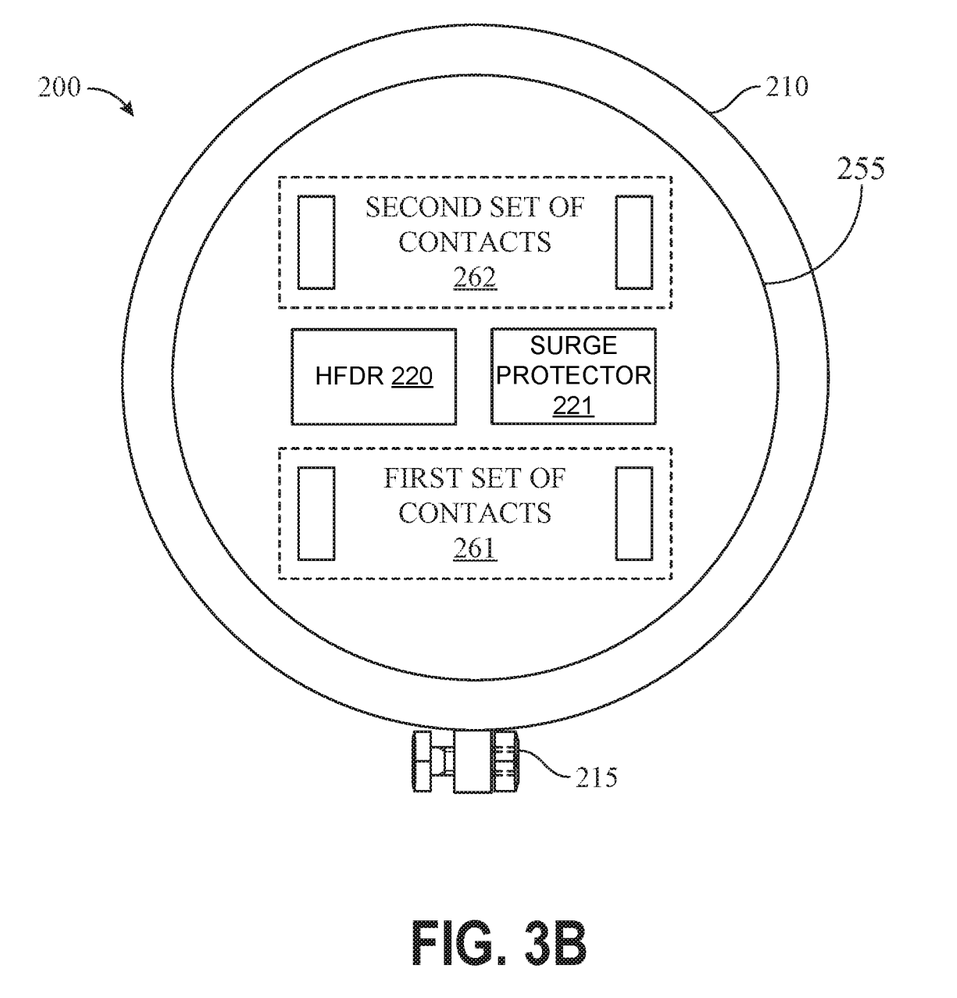
FIG. 3B illustrates a second side view of the power collar.

FIG. 3A illustrates a view of a first side of a power collar 200. FIG. 3B illustrates a view of a second side of the power collar 200 that opposes the first side of the power collar 200. The power collar 200 can be employed to implement the HFDR 120 of FIGS. 1 and 2. More particularly, the HFDR 120 of FIGS. 1 and 2 can be retrofitted into the power collar 200 without requiring reconfiguration of the meter box and/or the meter. The first side view of the power collar 200 represented in FIG. 3A can represent the first side of the HFDR 120 illustrated in FIGS. 1 and 2. A first side 205 of the power collar 200 is circumscribed (enveloped) by a meter ring 210. The meter ring 210 can include a fastener 215 to secure the first side 205 of the power collar 200 to a meter receptacle of a meter box. In some examples, the first side 205 of the power collar 200 can be secured to the meter receptacle of a meter box without the need for the meter ring 210. The power collar 200 can provide housing for an HFDR 220 and additional circuitry. Moreover, the power collar 200 can include additional circuitry to extend functionality. For example, the power collar 200 can include a surge protector 221 that provides that provides surge protection to the HFDR 220.

The first side 205 of the HFDR 200 includes a first set of contacts 251 that are pluggable into a meter receptacle situated in a meter box. Accordingly, the first set of contacts 251 can receive power from a power supply provided by the meter receptacle situated in the meter box. The first side of the power collar 200 can include a second set of contacts 252 that are pluggable into the meter receptacle situated in the meter box. Accordingly, the second set of contacts 252 can directly connect to a load provided by the meter receptacle via the meter box. The load can represent electrical equipment within a customer premises connected to the meter box. Additionally, the circuitry of HFDR 220 can be mounted on a plastic insulator situated in the power collar 200 to prevent short circuiting. Moreover, the plastic insulator of the HFDR 220 can be small enough to be situated between the first and second set of contacts 251-252.

As noted, FIG. 3B illustrates a second side 255 of the power collar 200, wherein the first side 205 of the power collar 200 is pluggable into a meter receptacle via contacts 251-252. Accordingly, the second side 255 of the power collar 200 can also be circumscribed by the meter ring 210. The second side 255 of the power collar 200 can include the fastener 215 of FIG. 3A (or possibly a second fastener) to secure the second side 255 of the power collar 200 to a meter. The second side 255 of the power collar 200 includes a first set of contacts 261 and a second set of contacts 262 that form a meter receptacle for the meter to plug into. The first set of contacts 261 on the second side 255 of the power collar 200 can provide a conductive path to the first set of contacts 251 on the first side of the power collar 200. Accordingly, the first set of contacts 261 on the second side 255 of the power collar 200 can provide power to the meter via the first set of contacts 251 on the first side 205 of the power collar 200. The second set of contacts 262 on the second side 255 of the power collar 200 can provide a conductive path to the second set of contacts 252 on first side 205 of the power collar 200. Accordingly, the second set of contacts 262 on the second side 255 of the power collar 200 can provide the meter with a connection to a load via the second set of contacts 252 on the first side 205 of the power collar 200. The HFDR 220 can also be mounted on a plastic insulator on the second side 255 of the power collar 200, instead of the first side 205 of the power collar 200. In some examples, the power collar 200 can be integrated with a surge shield 221 that provides surge protection the second side 255 of the power collar 200.

Figure 3C:
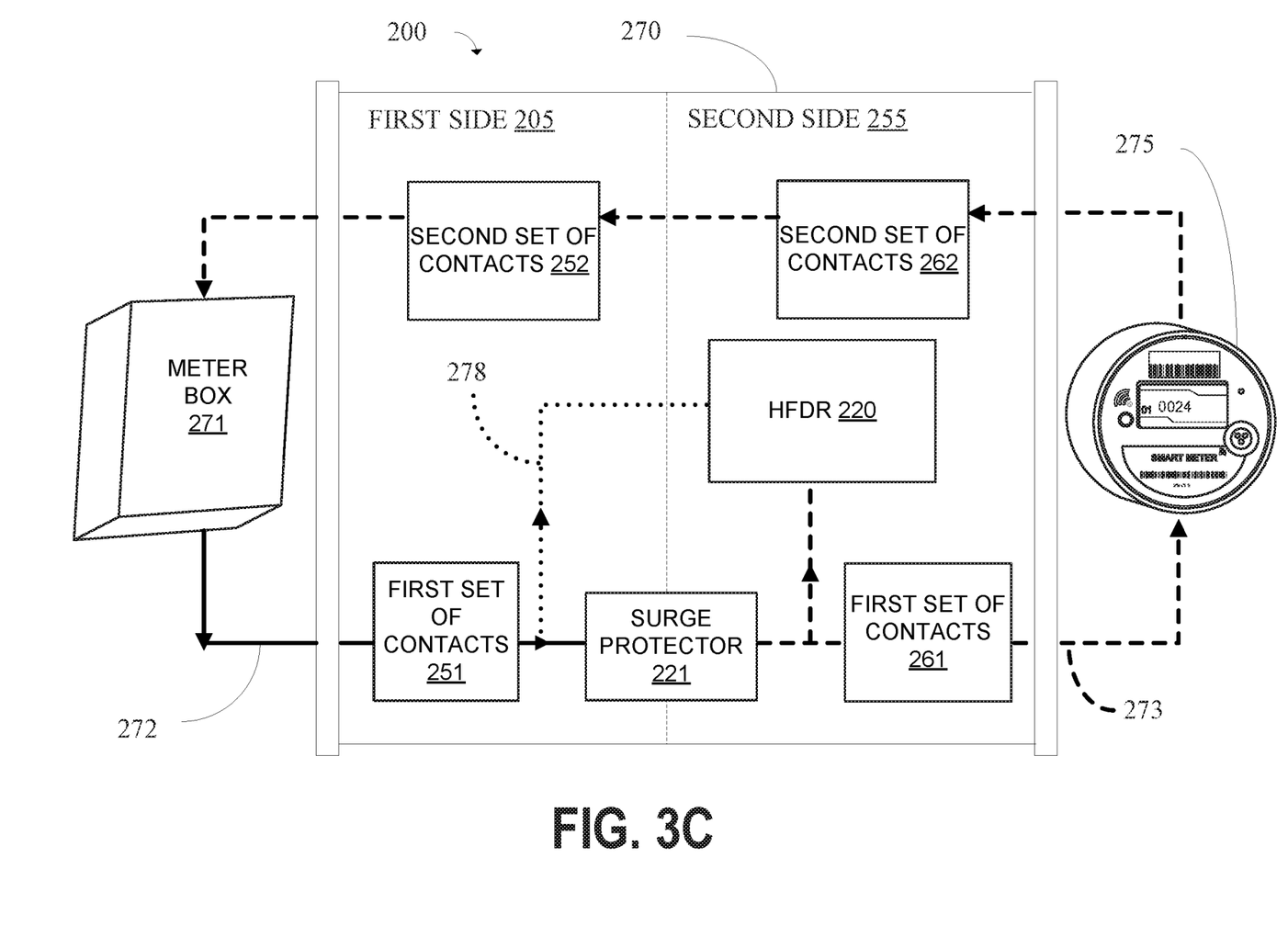
FIG. 3C illustrates a cross sectional view of the power collar.

FIG. 3C illustrates a cross sectional view 270 of the power collar 200. The cross-sectional view 270 of the power collar incorporates the first side 205 of the power collar 200 of FIG. 3A and the second side 255 of the power collar of FIG. 3B. The first side 205 of the power collar 200 is connected to a meter box 271 that supplies unprotected power 272 to the first set of contacts 251 of the first side 205 of the power collar 200. The meter box 271 can be implemented as the meter box 100 of FIG. 1. The unprotected power 272 is illustrated by a solid line and represents power that is provided by the meter box 271 and has not been protected by the surge protector 221. The surge protector 221 can receive the unprotected power 272 that flows through the first set of contacts 251 on the first side 205 of the power collar 200. Accordingly, the surge protector 221 provides protected power 273.

Protected power 273 is illustrated by a dashed line and represents power that is protected by the surge protector 221 from a surge in the power provided by the meter box 271. The protected power 273 can be received by the first set of contacts 261 on the second side 255 of the power collar 200, such that protected power 273 can be delivered to electrical equipment downstream from the surge protector 221. The electrical equipment downstream from the surge protector 221 can include the load representing electrical equipment within the customer premises provided by the meter box 271, as well as a meter 275 plugged into the second side 255 of the power collar 200. The meter 275 can be implemented as a meter 110 of FIG. 1. Additionally, the HFDR 220 can be mounted on and receive protected power 273 at the second side 255 of the power collar 200, such that the HFDR 220 is protected from a surge in the power delivered by the meter box 271. The HFDR 220 can sample a power signal 278 at the first side 205 of the power collar, such that the power signal 278 characterizes power consumed by the load at the first side 205 of the power collar 200.

The power signal 278 is illustrated as a dotted line and represents power consumed by the load measured by the HFDR 220. In some example, the HFDR 220 can receive the power signal 278 by measuring impedance on the first side 205 of the power collar 200. Additionally or alternatively, the HFDR 220 can receive the power signal 278 by measuring current on the first side 205 of the power collar. In other words, the surge protector 221 can protect the second side 255 of the power collar 200 including examples where the HFDR 220 that is mounted on the second side 255 of the power collar 200, and the meter 275 plugged into the second side 255 of the power collar 200. Because the meter 275 measures power consumed by the load from the protected second side 255 of the power collar 200 and the HFDR 220 measures power consumed by the load from the unprotected first side 205 of the power collar 200, the HFDR 220 can provide more accurate power measurements than the meter. More particularly, the power measured by the HFDR 220 reflects the power consumed by the power collar 200 (including the HFDR 220) and the meter 275. In contrast, the power measured by the meter 275 would not reflect the power consumed by components of the power collar 200, such as the HFDR 220 and the surge protector 221.

Figure 4:
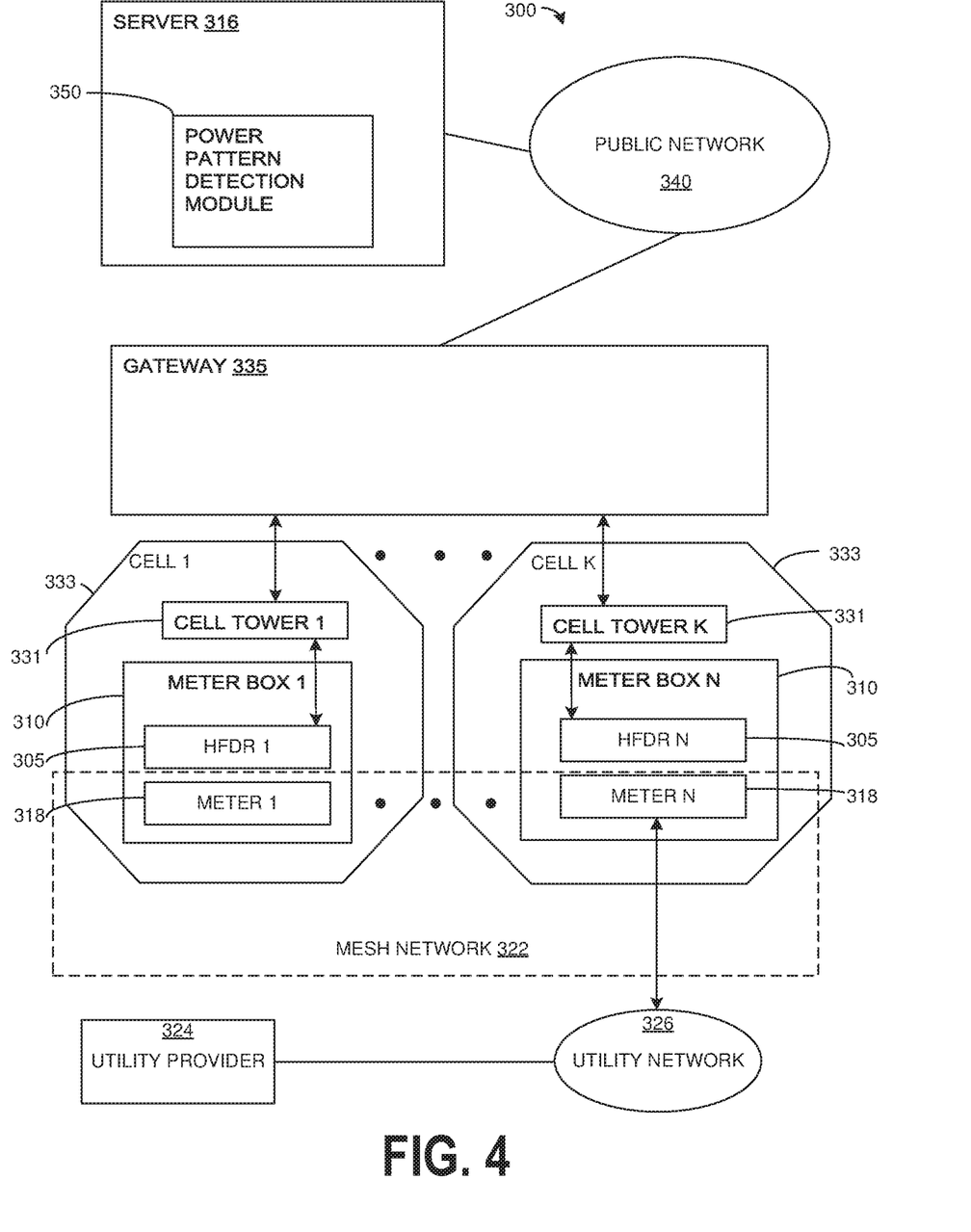
FIG. 4 illustrates a block diagram of an example of an HFDR communicating with a server via a cellular network.

FIG. 4 illustrates a block diagram of an example of N number of HFDRs 305 that are installed in corresponding N number of meter boxes 310, where N is an integer greater than or equal to one. Each of the N number of HFDRs communicates with a server 316 (or other computing platform) via a cellular network or other communication network. Each of the N number of HFDRs 305 are situated between a meter socket of the corresponding meter box 310 and a corresponding meter 318. In FIG. 4, each of the N number of meters 318 can communicate with other meters via mesh network 322 that can be implemented as mesh network 127 of FIG. 1. Each meter 318 of the plurality of meters 1-N 318 can meter power usage at a corresponding meter box 310. As previously discussed, data communicated through the mesh network 322 passes through the plurality of meters 1-N (or some subset thereof). Each pass through a meter 318 is called a "hop," such that a plurality of hops strung together form a stream of data. A stream of data is to be delivered to a utility provider 324 at the end of the string of hops. In some examples, the stream of data is delivered directly to the utility provider 324, which can be implemented as the utility server 125 of FIG. 1. In other examples, the stream of data is delivered to the utility provider 324 after passing through a utility network 326, which can be implemented as the utility network 128 of FIG. 1. However, the utility provider 324 and utility network 326 can have a bandwidth limitation for the stream of data received from the mesh network 322. Accordingly, data accumulates at each pass, limiting either the amount of times power is sampled at each meter or the number of hops that can be strung together.

Each of the N number of HFDRs 305 can be physically and electrically positioned between a corresponding meter 318 and a meter receptacle of the corresponding meter box 310. Each HFDR 305 of the N number of HFDRs 305 can record data characterizing power consumed by a corresponding a load of a corresponding customer premises. Each HFDR 305 can further communicate on a high bandwidth point-to-point network, such as a 5G, 4G LTE, or 3G cellular network or a Wi-Fi network. In some examples, different HFDRs 305 can communicate on different networks. For instance, a first subset of the N number of HFDRs 305 may communication on an LTE network, while a second subset of the N number of HFDRs 305 communication on a 5G network and a third subset of the N number of HFDRs 305 communicate on a WiFi network.

For example, a first HFDR 305 (labeled in FIG. 4 as "HFDR 1") can communicate with a first cell tower 331 of K number of cell towers 331 within a corresponding cell 333 of K number of cells 333 that form a cellular network (or some portion thereof), where K is an integer greater than or equal to one. Each cell tower 331 of the K number of cell towers 331 communicates with a gateway 335 for a public network 340 (e.g., the Internet). The public network 340 can be implemented as the Internet. Because the first HFDR 305 is capable of communicating via the cellular network formed by the K number of cell towers 331, the first HFDR 305 can transmit recorded data to a remote server (e.g., the server 316) by communicating with the public network 340 through the gateway 335.

Each of the second to Nth HFDRs 305 (e.g., HFDRs 2-N) can be implemented in a manner similar to the first HFDR 305. In some examples, the gateway 335 can be a smart gateway that has capability to manage large amounts of data generated by up to thousands of HFDRs 305. A smart gateway can connect to disparate cell towers 331 from different cells 333 and translate different communication protocols. Accordingly, the HFDR 305 can communicate with the gateway 335 via 5G while a second HFDR 305 contemporaneously communicates with the gateway 335 via Wi-Fi. In some instances, the first cell tower 331 of the K number of cell towers 331 corresponding to the first HFDR 305 can be equipped with infrastructure to support 5G communications, while a second cell tower 331 of the K number of cell towers 331 corresponding to the second HFDR 305 is not equipped with infrastructure to support 5G. Yet, the gateway 335 can communicate with both the first cell tower 331 via 5G, as well as the second cell tower 331 via Wi-Fi.

Additionally or alternatively, the gateway 335 can also include on-board intelligence to hand local decision making and monitoring, as well as intelligently filter data collected from a plurality of K number of cell towers 331 (or some subset thereof). Accordingly, the gateway 335 can transmit large amounts of data to a server 316 via the public network 340. Relative to the mesh network 322, the gateway 335 and public network 340 have a much higher bandwidth than the mesh network 322, thereby enabling transmission of a higher volume of data to a server 316 at a lower latency. In particular, the N number of HFDRs 305 are not limited to communicating via a mesh network and transmitting data that accumulates in other devices, such that the N number of HFDRs 305 can sample power at higher frequencies than meters 318 on the mesh network 322. For example, an HFDR 305 can sample power and transmit data characterizing the sampled data at 2000 times per second or more (e.g., millions of times per second), where a given meter 318 communicating on the mesh network 322 can be limited to transmitting data charactering sampled power at 1 time per hour. In other examples, the HFDR 305 samples power and transmits data characterizing the sampled data at millions of times per second, where the given meter 318 is a smart meter communicates on the mesh network 322 is limited to transmitting data characterizing sampled power at 15 times per second.

In examples where the given meter 318 is a smart meter, the smart meter acts as a mesh node communicating on the mesh network 322. A mesh node enables other smart meters and mesh network elements to communicate with a utility network 326 via a string of hops. Because smart meters sample power at 15 samples per second and communicate via mesh network, the given meter 318 (a smart meter) can be used to transmit low priority data characterizing power. Aggregated low priority data can be used to indicate state information for a power grid or smart grid. State information of a smart grid can be used to implement smart grid fault detection and state information of a power grid can be used to indicate necessary power grid maintenance. Because an HFDR 305 can sample power at 2000 times per second or more (e.g., millions of times per second) and communicate via a cellular network, an HFDR 305 can be used to transmit high priority data characterizing power. High priority data can be used for grid management. The high priority data sampled and transmitted by the HFDR 305 can be routed separately from the low priority data sampled by the smart meter. Routing data from the HFDR 305 and smart meter separately can prevent sampled power data from being reused. If redundant data is transmitted by both the HFDR 305 and smart meter, the data sampled by the HFDR 305 and smart meter can be compared to determine whether a defect is present at the smart meter—HFDR system.

Additionally, in some examples some or all of the N number of HFDRs 305 can be configured to communicate with a local area network (LAN), such as a Wi-Fi network. For instance, some of the N number of HFDRs 305 can be installed at a meter box 310 at a customer premises, which can employ an LAN such as Wi-Fi. When the HFDR 305 is installed at a meter box at a customer premises, the HFDR 305 can use the Wi-Fi at the customer premises to communicate with the server 316.

The server 316 can be implemented as a computing platform with a non-transitory memory (e.g., random access memory, a hard disk drive, a solid state drive and/or flash memory) that stores machine readable instructions. The server 316 can also include a processing unit (e.g., one or more processor cores) that accesses the non-transitory memory and executes the machine readable instructions. The server 316 can still further include a network interface controller for communicating on the public network 340. Moreover, the server 316 could be implemented in a computing cloud. In such a situation, features of the server 316, such as the processing unit, a network interface, and the memory could be representative of a single instance of hardware or multiple instances of hardware with applications executing across the multiple of instances (i.e., distributed) of hardware (e.g., computers, routers, memory, processors, or a combination thereof). Alternatively, the server 316 could be implemented on a single dedicated server.

Because the N number of HFDRs 305 can sample power at a high frequency at a rate of at least 2000 times per second or more (e.g., millions of times per second), the N number of HFDR 305 generates large amounts of data that is provided to a server 316. The server 316 can be further implemented to receive, store and analyze large amounts of data generated by of the N number of HFDRs 305 (or some subset thereof) and transmitted via a gateway 335. For example, the server 316 can execute a power pattern detection module 350 that analyzes data to recognize patterns in the data. The power pattern detection module 350 can use recognized patterns to predict data and generate a threshold characterized by a statistical deviation from average values of data collected. The average values can include demand for electricity on a daily, weekly, and seasonal basis. Accordingly, the power pattern detection module 350 can predict when power will be consumed at a specific meter box based on average daily power consumption during a particular season. For example, during summer days with high temperature when most customer premises have loads using air conditioning, the power pattern detection module 350 can predict a higher amount of power consumption is within the threshold characterized by the average daily power consumption during a high temperature season.

Additionally or alternatively, the power pattern detection module 350 may be programmed recognize anomalies such as when the power consumption is higher or lower than expected using the threshold characterized by a statistical deviation from average values of data collected. Accordingly, the power pattern detection module 350 can recognize when power consumption is much lower than average during a high temperature day. When an anomaly is recognized, the power pattern detection module 350 can classify the anomaly as a particular issue. That is, if power consumption is much lower than average on a high temperature day, the power pattern detection module 350 can recognize a possible problem with an air conditioning unit associated with a particular HFDR 305 of the N number of HFDRs 305. On the other hand, the power pattern detection module 350 can determine a possible problem if the power pattern detection module 350 recognizes that power consumption has exceed a threshold characterized by average power consumption. Accordingly, determinations of problems based on anomalous power consumption can be provided to a utility provider 324 that can alter power distribution based on the power distribution.

Also because the N number of HFDRs 305 can sample power consumed at the corresponding customer premises at a high frequency at a rate of at least 2000 times per second or more (e.g., millions of times per second), each HFDR 305 of the N number of HFDRs 305 can generate large amounts of granular data that is provided to a server 316. Accordingly, the power pattern detection module 350 can determine an expected power consumption for individual devices in a load. For example, the power pattern detection module 350 can be provided with data that characterizes an air conditioner's make and model, as well as data characterizing expected power consumption when turned on. When a particular device such as an air conditioner is turned on, the particular device generates a unique power signal signature that can be measured in power. Based on the particular device's power consumption when turned on and during operation, the power pattern detection module 350 can recognize a when a particular device is turned on based on an expected power signal corresponding to the device, such as a particular model air conditioner.

Additionally, the power pattern detection module 350 can determine an expected power signal of a particular device based on data that characterizes expected power consumption when turned on. In fact, an unknown particular device can be identified by the power pattern detection module 350 by recognizing the corresponding expected power signal of the particular device. Furthermore, the power pattern detection module 350 can determine whether the air conditioner is operating as expected by determining whether the recognized power signal is within a threshold characterized by a statistical deviation from average values of data collected. The air conditioner can be considered in a normal mode of operation if the recognized power signal is within the threshold. An anomaly in the power signal of a particular device when turned or during operation, such as an air conditioner, can indicate problems with the device. That is, an anomalous power signal can be classified into specific problems for particular devices. For example, the power pattern detection module 350 can determine that a particular anomalous power signal associated with an air conditioner indicates that an air filter needs to be changed.

Moreover, the server 360 can implement subtractive metering on received data characterizing power consumed by a load. The HFDR 305 consumes power to sample power consumed by the load and transmit data characterizing the power consumed by the load. The load represents electrical equipment at a respective customer premises. In some examples, the server 360 can implement subtractive metering to include data characterizing power consumed by the HFDR 305 with data characterizing power consumed by the load. Accordingly, costs associated with power consumed by the HFDR 305 can be charged to a customer associated with the customer premises at a respective meter box. In other examples, the server 360 can implement subtractive metering to prevent data characterizing power consumed by the HFDR 305 from being combined with data characterizing power consumed by the load at the customer premises. Accordingly, in these examples, cost associated with power consumed by the HFDR 305 can be subsidized by a third party.

Figure 5:
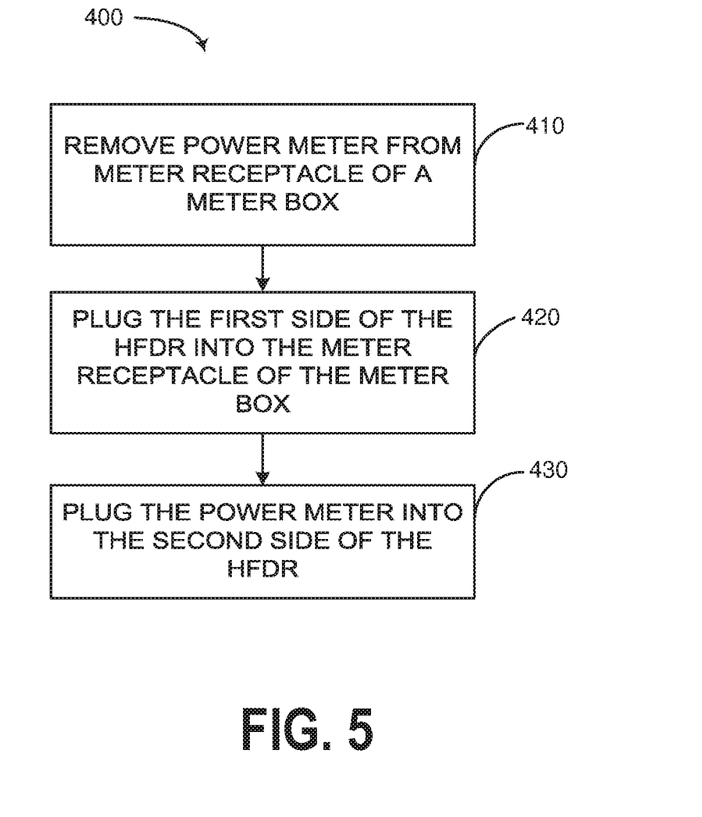
FIG. 5 illustrates a flowchart of an example method for installing an HFDR.
Figure 6:
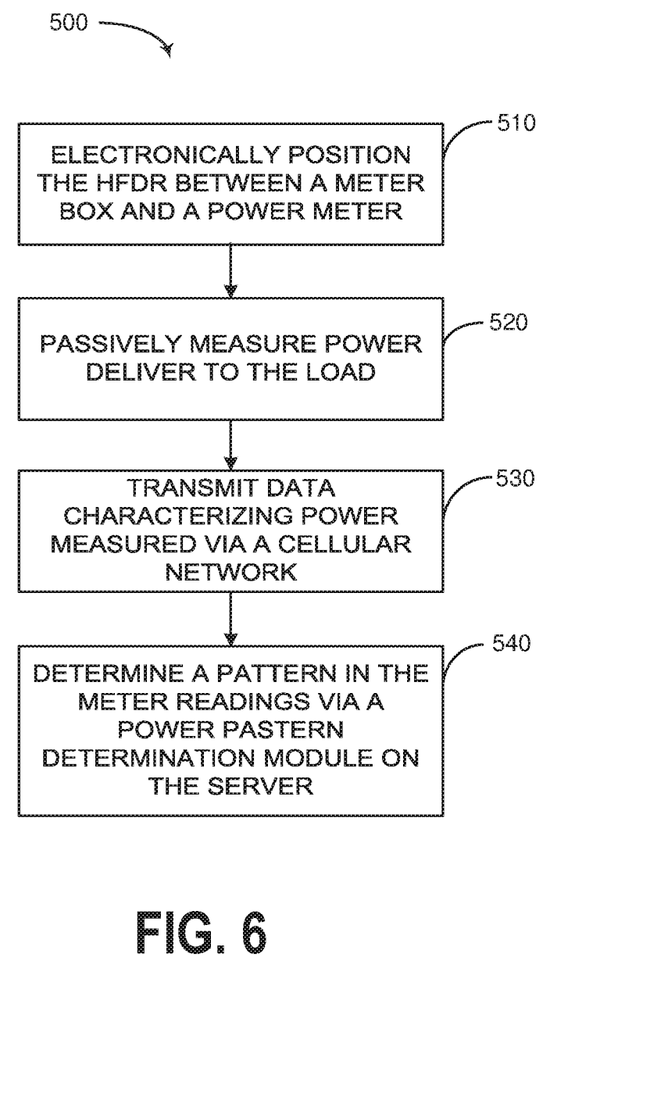
FIG. 6 illustrates a flowchart of an example method for measuring and transmitting data via an HFDR.

In view of the foregoing structural and functional features described above, an example method will be better appreciated with reference to FIGS. 5 and 6. While, for purposes of simplicity of explanation, the example methods of FIGS. 5 and 6 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 5 illustrates a flowchart of an example method 400 for installing an HFDR at a meter box at a customer premises. The meter box can be implemented as the meter box 100 of FIG. 1 and can be accessible from the outside of the customer premises, such that the HFDR can be installed without entering the customer premises. The meter box further includes a meter receptacle, which can be implemented as meter socket 115 of FIG. 1 and can have a meter plugged into the meter receptacle. The meter can be implemented as meter 110 of FIG. 1. The method 400 for installing the HFDR is as simple as installing a meter. At 410, the meter is removed from the meter receptacle of the meter box. At 420, a first side of the HFDR is plugged into the meter receptacle of the meter box. The HFDR is plugged into the meter receptacle in a similar manner to a meter. At 430, the meter is plugged into a second side of the HFDR, the second side opposing the first side of the HFDR. The meter is plugged into the second side of the HFDR in manner similar to the meter being plugged into the meter receptacle. Accordingly, the HFDR is retrofitted to the meter box. Retrofitting is adding a capability or component to an older system to extend functionality.

FIG. 6 illustrates a flowchart of an example method 500 for sampling power consumed at a customer premises with an HFDR. The HFDR can be implemented as HFDR 120 of FIGS. 1 and 2. At 510, the HFDR is both electrically and physically positioned between a meter box and a power meter, which can be implemented by the method 400 of FIG. 5. At 520 of FIG. 6, the installed HFDR can passively measure power consumed by a load. That is, the HFDR can unobstructively measure power as current flows through meter box. At 530, the HFDR can transmit data characterizing the power measured via a cellular network. At 550, the data characterizing the power measured is delivered a power pattern determination module on the server. Accordingly, power pattern detection module can detect anomalies in the measured data by comparing the measured data to expected data in a manner described herein.

What is claimed:

1. A high frequency data recorder ("HFDR") comprising:
   a first set of contacts, on a first side of the HFDR, that are pluggable into a first meter receptacle of a meter box, wherein the first meter receptacle provides a connection to a power supply and a connection to a load;
   a second set of contacts, on a second side of the HFDR, that form a second meter receptacle and are configured to receive a meter that is pluggable into the first meter receptacle of the meter box, wherein the second meter receptacle provides another connection to the power supply and another connection to the load;
a processor that accesses a non-transitory machine readable memory that stores instruction that when executed cause the processor to passively measure a current downstream from the meter box; and
a wireless transceiver that wirelessly transmits data characterizing the measured current downstream from the meter box.

2. The HFDR of claim 1, wherein the data characterizing the measured current downstream from the meter box consumed by the load to is transmitted to a server via a public network.

3. The HFDR of claim 2, wherein the wireless transceiver of the HFDR transmits the data characterizing the measured current downstream from the meter box to the server via a cellular network.

4. The HFDR of claim 1, wherein the HFDR is integrated with a power collar.

5. The HFDR of claim 4, wherein the meter is a smart meter, and the smart meter is plugged into the second set of contacts on the second side of the HFDR integrated with the power collar.

6. The HFDR of claim 5, wherein the power collar further comprises a surge shield that provides surge protection to electrical equipment downstream from the first meter receptacle.

7. The HFDR of claim 6, wherein the HFDR is circumscribed by a meter ring that includes a fastener to secure the meter to the power collar.

8. The HFDR of claim 7, wherein circuitry of the HFDR is mounted on a plastic insulator to prevent short circuiting.

9. The HFDR of claim 1, wherein the processor samples the current downstream from the meter box at least 2000 times per second to measure the current downstream from the meter box consumed by the load.

10. The HFDR of claim 1, wherein the HFDR is retrofitted to the meter box, wherein the HFDR extends functionality of the meter box without reconfiguration of the meter box or the meter.

11. The HFDR of claim 1, wherein the meter box is positioned an outside of a customer premises.

12. The HFDR of claim 1, wherein the HFDR is configured to passively measure impedance across the load.

13. The HFDR of claim 1, wherein the HFDR is electrically and physically positioned between the meter box and the meter.

14. A system for measuring and transmitting power measurements comprising:
a power collar comprising:
a first side with connectors pluggable into a first meter receptacle of a meter box, wherein the first meter receptacle provides a connection to a power supply and a load representing electrical equipment;
a second side, opposite the first side, the second side comprising a second meter receptacle for a meter that is pluggable into the first meter receptacle of the meter box;
a high frequency data recorder ("HFDR") the HFDR comprising:
processor that accesses a non-transitory machine readable memory that stores instruction that when executed cause the processor to passively measures power supplied to the load at least 2000 samples per second; and
a transceiver that wirelessly transmits data characterizing the measured power supplied to the load;
the meter is pluggable into the second meter receptacle of the power collar; and
a remote server that receives the data characterizing the measured power supplied to the load from the HFDR, wherein the remote server employs a power pattern detector module to analyze the data.

15. The system of claim 14, wherein the power collar comprising the HFDR is retrofitted to the meter box and the meter, and the meter was previously plugged into the meter box.

16. The system of claim 14, wherein the meter is a smart meter, the transceiver of the HFDR communicates with the remote server via a first protocol and the smart meter communicates with the remote server via a second protocol.

17. The system of claim 16, wherein the first protocol employed to communicate by the transceiver of the HFDR is a cellular protocol or a Wi-Fi protocol and the second protocol employed to communicate by the smart meter is a mesh network protocol.

18. The system of claim 14, wherein the power collar further comprises a surge protector that provides surge protection to the HFDR and the meter on the second side of the power collar, such that the HFDR measures a first power of the measured power supplied to the load on the first side of the power collar and the meter measures a second power of the measured power supplied to by the load on the second side of the power collar.

* * * * *